(12) United States Patent
Bogner et al.

(10) Patent No.: US 7,726,835 B2
(45) Date of Patent: Jun. 1, 2010

(54) LED ARRAY

(75) Inventors: Georg Bogner, Lappersdorf (DE);
Moritz Engl, Regensburg (DE); Stefan Grötsch, Lengfeld/Bad Abbach (DE);
Patrick Kromotis, Regensburg (DE);
Jorg Erich Sorg, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 11/816,951

(22) PCT Filed: Feb. 6, 2006

(86) PCT No.: PCT/DE2006/000191
§ 371 (c)(1),
(2), (4) Date: Apr. 9, 2008

(87) PCT Pub. No.: WO2006/089508
PCT Pub. Date: Aug. 31, 2006

(65) Prior Publication Data
US 2009/0103297 A1 Apr. 23, 2009

(30) Foreign Application Priority Data
Feb. 28, 2005 (DE) ........................ 10 2005 009 059
Apr. 26, 2005 (DE) ........................ 10 2005 019 375

(51) Int. Cl.
*H01L 27/15* (2006.01)
(52) U.S. Cl. .................. 362/235; 362/613; 362/249.01; 362/227; 362/237
(58) Field of Classification Search ................. 362/235, 362/800, 227, 613, 249.01
See application file for complete search history.

(56) References Cited

U.S. PATENT DOCUMENTS 3,642,457 A    2/1972   Brill-Edwards (Continued)

FOREIGN PATENT DOCUMENTS

CN    1487605 A    7/2004

(Continued)

OTHER PUBLICATIONS

Notification for the Opinion of Examination for Taiwan Patent Application No. 95106016 dated Jun. 27, 2008.

(Continued)

*Primary Examiner*—Anabel M Ton
(74) *Attorney, Agent, or Firm*—Fish & Richardson P.C.

(57) ABSTRACT

In an LED array comprising a plurality of radiation-emitting semiconductor chips each of which has a radiation outcoupling surface, the radiation emitted by the semiconductor chips being outcoupled substantially through said radiation outcoupling surface, and a cover body that is transparent to the emitted radiation, the transparent cover body comprises, on a surface facing toward the radiation outcoupling surfaces of the semiconductor chips, one or more conductive traces made of a conductive material that is transparent to the emitted radiation, and the semiconductor chips each comprise, on the radiation outcoupling surface, at least one electrical contact that is connected to the conductive trace or to at least one of the plurality of conductive traces. At least one luminescence conversion material is contained in the transparent cover body and/or applied in a layer to the cover body and/or the semiconductor chips.

17 Claims, 1 Drawing Sheet

U.S. PATENT DOCUMENTS

| | | | |
|---|---|---|---|
| 5,261,013 A * | 11/1993 | Murata et al. | 358/471 |
| 6,066,861 A | 5/2000 | Höhn et al. | |
| 7,078,732 B1 | 7/2006 | Reeh et al. | |
| 2004/0012957 A1 | 1/2004 | Bachl et al. | |
| 2004/0041159 A1 | 3/2004 | Yuri et al. | |
| 2004/0069999 A1 | 4/2004 | Lin et al. | |
| 2004/0120155 A1 | 6/2004 | Suenaga | |
| 2004/0222947 A1 | 11/2004 | Newton et al. | |
| 2007/0008734 A1 | 1/2007 | Bogner et al. | 362/509 |

FOREIGN PATENT DOCUMENTS

| | | |
|---|---|---|
| CN | 1545146 | 11/2004 |
| DE | 19603444 | 8/1997 |
| DE | 19922361 | 11/2000 |
| DE | 20122195 | 10/2004 |
| DE | 10353679 | 6/2005 |
| EP | 0878026 | 11/1998 |
| JP | 4-29379 | 1/1992 |
| JP | 6-21512 | 1/1994 |
| JP | 6-334222 | 12/1994 |
| JP | 6-342939 | 12/1994 |
| WO | WO 97/50132 | 12/1997 |
| WO | WO 98/12757 | 3/1998 |
| WO | WO 2004/068596 | 8/2004 |
| WO | 2004/088200 | 10/2004 |
| WO | WO 2004/102064 | 11/2004 |
| WO | WO 2005/050746 | 6/2005 |

OTHER PUBLICATIONS

English Translation of Notification of First Office Action and Chinese Office Action, Appln. No. 200680005818.6, Aug. 1, 2008, 10 pages.

Schnitzer, I. et al., "30% External Quantum Efficiency from Surface Textured, Thin-film Light—emitting Diodes", Appl. Phys. Lett., vol. 63, No. 16, 214-2176, 1993.

Takahashi, K. et al., "High Density LED display Panel on Silicon Microreflector and Integrated Circuit", *Electronic Manufacturing technology Sympostum, 1995, Proceedings of 1995 Japan International*, pp. 272-275,; XP010195599.

International Search Report for PCT/DE2006/000191, dated May 19, 2006.

Wang, Xingyan, English translation of the "Notification of the Second Office Action", Chinese Application No. 200680005818.6, Jun. 5, 2009 (8 pages).

* cited by examiner

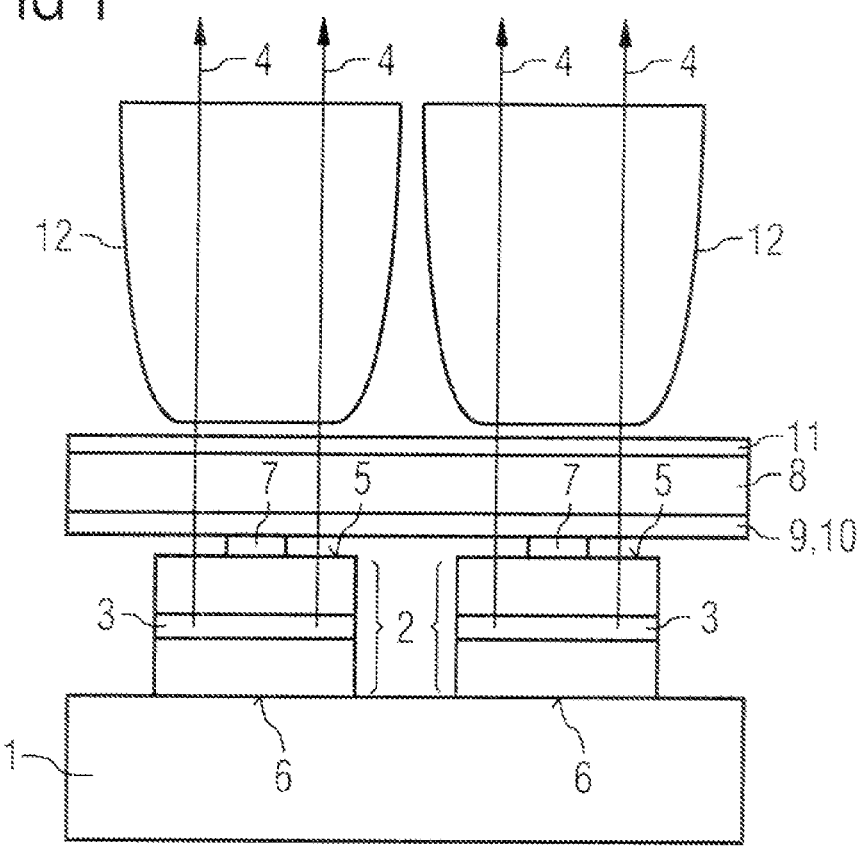
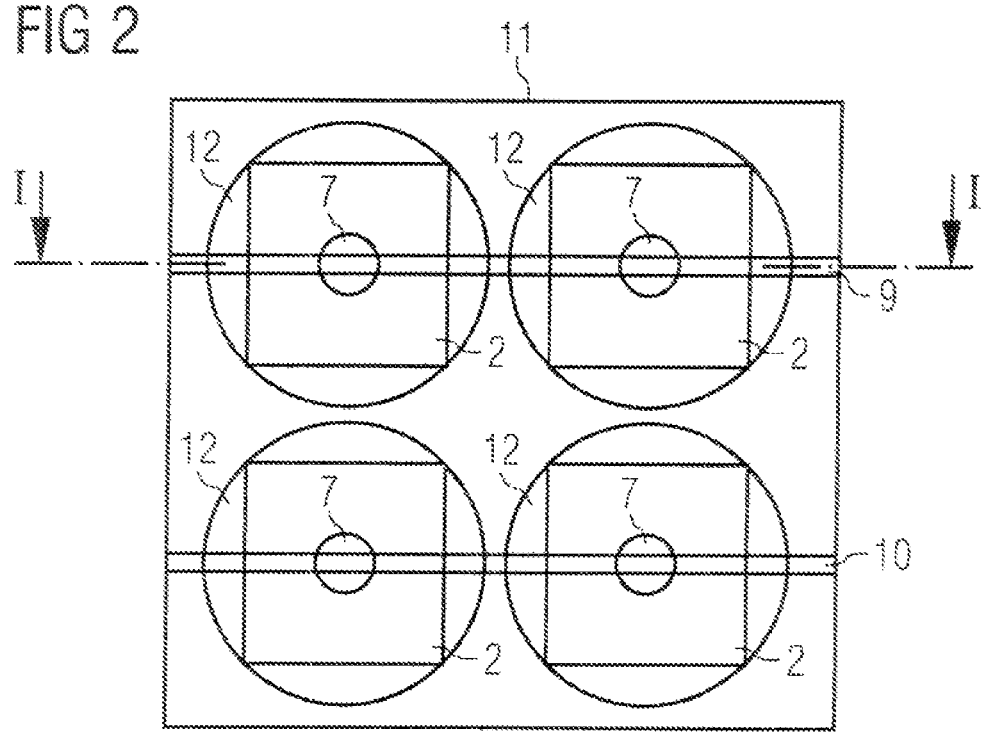

LED ARRAY

CROSS-REFERENCE TO RELATED APPLICATIONS

This application is the National Stage of International Application No. PCT/DE2006/000191, filed on Feb. 6, 2006, which claims the priority to German Patent Applications Serial No. 102005009059.1, filed on Feb. 28, 2005 and Serial No. 102005019375.7, filed on Apr. 26, 2005. The contents of all applications are hereby incorporated by reference in their entireties.

The invention relates to an LED array according to the preamble of claim 1.

FIELD OF THE INVENTION

The invention relates to a light emitting diode ("LED") array.

BACKGROUND

LED arrays are distinguished by high efficiency, long life, fast response times and relatively low sensitivity to impacts and vibrations. For this reason, LED arrays are being used with increasing frequency in lighting devices where incandescent lamps have often been used heretofore, particularly in motor vehicle headlights, reading lamps or flashlights. Because of their high luminosity, LED arrays have also now proven suitable for use in traffic signal systems or projected light sources.

In LED arrays that are used for such lighting purposes, the LED chips are usually driven at high operating currents to obtain the highest possible luminance. For example, operating currents of 1 A or more may occur. So that the electrical contacting of the semiconductor chip is able to withstand such high currents over the long term, bonding wires 30 μm or more in diameter are typically used to contact semiconductor chips in high-power LED modules. However, the use of these relatively thick bonding wires causes some of the radiation emitted by the LEDs to be blocked by the bonding wires. In addition, the bonding wires make it difficult to mount optical elements close above the surface of the semiconductor chip, since the radius of curvature of the wires, and thus the amount of space they occupy above the chip surface, cannot be reduced arbitrarily.

In applications of LED arrays, particularly in projected light sources, it is necessary for light to be emitted within the tightest possible range of solid angles. Since LEDs, however, usually have a relatively broad range of emission angles, optical elements are necessary for this purpose. It is desirable in this case to get the optical elements as close as possible to the semiconductor chips, in order to achieve compact construction and to be able to make use of the largest possible fraction of the radiation emitted by the semiconductor chip. This is hampered, however, by the use of bonding wires for contacting.

From the document WO 98/12757, it is known to embed an optoelectronic semiconductor chip, contacted with a bonding wire in a conventional manner, in a potting compound containing luminescence conversion materials, in order to convert at least a portion of the radiation emitted by the semiconductor chip to higher wavelengths. In this way, a semiconductor chip that emits blue or ultraviolet light, for example, can be used to generate mixed-color or white light. However, embedding the semiconductor chip in a potting compound raises problems in the case of LED arrays, which are operated at relatively high currents, since the potting compound impedes heat dissipation from the semiconductor chip.

The document WO 97/50132 also describes applying a luminescence conversion layer to a cover plate of an LED housing, an LED chip contacted with a bonding wire in a conventional manner being positioned in the housing.

Described in the document DE 19603444 is an LED device in which the LEDs are contacted by means of metallic conductive traces that are applied to a transparent plate. In this type of contacting, a portion of the radiation emitted by the LEDs is absorbed in the metallic conductive traces.

SUMMARY

The object underlying the invention is to specify an LED array with improved electrical contacting, which array is distinguished by minimal blocking of the radiation emitted by the semiconductor chips and an advantageously flat construction that allows optical elements to be positioned closely above the surface of the semiconductor chip. In addition, luminescence conversion of the radiation emitted by the semiconductor chips is to take place at a relatively small distance from the semiconductor chips.

In an LED array according to the invention, comprising a plurality of radiation-emitting semiconductor chips each of which has a radiation outcoupling surface, the radiation emitted by the semiconductor chips being outcoupled substantially through said radiation, outcoupling surface, and a cover body that is transparent to the emitted radiation, the transparent cover body comprises, on a surface facing toward the radiation outcoupling surfaces of the semiconductor chips, one or more conductive traces made of a conductive material mat is transparent to the emitted radiation, and the semiconductor chips each comprise, on the radiation outcoupling surface, at least one electrical contact that is connected to the conductive trace or to at least one of the plurality of conductive traces.

Contacting the semiconductor chips by means of the at least one transparent conductive trace applied to the cover body advantageously eliminates the need for any bonding wires that would make it difficult to mount optical elements above the semiconductor chips and/or would block a portion of the radiation emitted by the semiconductor chips. The use of a conductive trace that is transparent to the emitted radiation has the advantage that the conductive trace can be dimensioned, particularly in terms of thickness and width, such that it is able to sustain high currents, for example of 1 A or more, without any shading of the radiation-emitting semiconductor chips. In particular, it becomes possible to apply one or more transparent conductive traces to regions of the cover body through which the radiation emitted by the semiconductor chips passes, without substantial absorption losses occurring when the LED array is in operation. This in particular makes it easier to connect a multiplicity of radiation-emitting semiconductor chips in an LED array into a series or parallel circuit.

The transparent conductive material is preferably a transparent conductive oxide. The transparent conductive oxide can, in particular, be indium tin oxide (ITO).

In addition, it is provided, in an LED array according to the invention, to wavelength-convert at least a portion of the radiation emitted by the semiconductor chip to higher wavelengths. To this end, advantageously at least one luminescence conversion material is contained in the cover body and/or applied in a layer to the cover body and/or to the semiconductor chip. In this way, for example, semiconductor chips that emit ultraviolet or blue radiation can be used to generate white light Suitable luminescence conversion materials, such as, for example, YAG:CE ($Y_3Al_5O_{12}:Ce^{3+}$) are known from WO 98/12757, whose content in this regard is hereby incorporated by reference.

The electrical contacts of the semiconductor chips are preferably connected by means of a solder or an electrically conductive adhesive to the conductive traces applied to the cover body. The solder or electrically conductive glue can be applied, for example, in dots or in an arbitrary structure to the radiation outcoupling surface of each semiconductor chip.

The cover body is advantageously a cover plate. The thickness of the cover plate is preferably 100 μm or less, particularly preferably 50 μm or less. In a further preferred configuration of the invention, the cover body is a transparent cover film.

Disposed after the cover body, as viewed from the semiconductor chips, can be one or more beam-shaping optical elements, which advantageously are only a relatively small distance from the radiation outcoupling surface that belongs to each semiconductor chip and from which, the radiation is outcoupled. Particularly preferably, at least one optical element is disposed at a distance of 300 μm or less from the radiation outcoupling surfaces of the semiconductor chips.

In a farther preferred embodiment, the cover body itself is configured as a beam-shaping optical element. In particular, the surface of the cover body facing away from the semiconductor chips can be shaped or structured as a refractive optical element, particularly in the form of a lens.

The beam-shaping optical element is preferably a hollow body with a light entrance opening facing the semiconductor chips and a light exit opening disposed opposite the light entrance opening, at least a portion of the radiation emitted by the semiconductor chip or chips being reflected to the light exit opening by a wall of the hollow body.

The divergence of the radiation emitted by the semiconductor chip is advantageously reduced by the beam-shaping optical element. One advantageous implementation of the beam-shaping optical element is to have the cross section of the hollow body increase from the light entrance opening to the oppositely disposed light exit opening. In addition, the hollow body can have an axis of symmetry that is parallel to a main beam direction of the radiation-emitting semiconductor chip.

The beam-shaping optical element can, for example, be a hollow body tilled with a potting material. This potting material is preferably a UV-stable material, such as silicone, for example.

A wall of the hollow body preferably has a curvature in order to achieve a desired optical functionality. In particular, the wall of the hollow body can be curved aspherically, for example parabolically, elliptically or hyperbolically.

The beam-shaping optical element is configured for example as a CPC-, CEC- or CHC-type optical concentrator, by which is meant hereinafter a concentrator whose reflective side surfaces have, at least in part and/or at least virtually entirely, the shape of a compound parabolic concentrator (CPC), a compound elliptic concentrator (CEC) or a compound hyperbolic concentrator (CHC). In this case, the surface of the cover body that faces toward the semiconductor chips is the actual concentrator output aperture, so that, in contrast to the customary use of a concentrator for focusing, here radiation passes through the concentrator in the opposite direction and thus is not concentrated, but leaves the cover body through the opposite surface with reduced divergence.

The cover body is preferably made of a material whose thermal expansion coefficient is substantially the same as the thermal expansion coefficient of the semiconductor material of the semiconductor chips. This advantageously reduces temperature-variation-induced mechanical stresses between the semiconductor chips and the cover body that could otherwise lead to damage or even breaking of the connection.

In a preferred embodiment of the invention, the cover body is made of a glass, particularly preferably a borosilicate glass.

With respect to the efficiency of the luminescence conversion, it is particularly advantageous if the cover body is disposed at a relatively small distance from the radiation outcoupling surfaces belonging to the semiconductor chips and provided to outcouple the radiation. The cover body is advantageously held spaced apart by a solder or an electrically conductive adhesive. In particular, the cover body can rest partially or even completely on the radiation outcoupling surface of the respective semiconductor chip. Furthermore, it is also possible for a gap between the semiconductor chips and their cover plates to be filled with silicone, in particular so as to reduce a jump in refractive index between the semiconductor chips and the surrounding medium, and thus to improve the outcoupling of the radiation from the semiconductor chips.

The semiconductor chips preferably contain a III-V compound semiconductor material, particularly $In_xAl_yGa_{1-x-y}N$, $In_xAl_yGa_{1-x-y}P$ or $In_xAl_yGa_{1-x-y}As$, where In each case $0 \leq x \leq 1$, $0 \leq y \leq 1$ and $x+y \leq 1$. This III-V compound semiconductor material need not necessarily have a composition that accords mathematically exactly with the above formulas. It may instead contain one or more dopants and additional constituents that do not substantially alter the physical properties of the material For the sake of simplicity, however, the above formulas contain only the essential constituents of the crystal lattice, even though they may be replaced in part by very small quantities of additional substances.

The semiconductor chips advantageously comprise, disposed opposite the radiation outcoupling surface, a base surface by which they are mounted on a carrier body. Particularly preferably, the semiconductor chips of the LED arrays are mounted on a common carrier body. The carrier body is preferably fabricated from a metal-ceramic, for example AlN.

Particularly preferably, the semiconductor chips are so-called thin-film light-emitting diode (LED) chips, made by first epitaxially growing a functional semiconductor layer sequence on a growth substrate, subsequently applying a new carrier to the surface of the semiconductor layer sequence opposite the growth substrate, and then detaching the growth substrate. This has, in particular, the advantage that the growth substrate can be reused.

A thin-film LED chip is distinguished in particular by the following characteristic features:

applied to or configured on a first main surface, facing a carrier, of a radiation-generating epitaxial layer sequence is a reflective layer that reflects at least a portion of the electromagnetic radiation generated in the epitaxial layer sequence back thereinto;

the epitaxial layer sequence has a thickness in the range of 20 μm or less, particularly in the range of 10 μm; and the epitaxial layer sequence comprises at least one semiconductor layer that has at least one surface with an intermixing structure, which in the ideal case brings about a nearly ergodic distribution of the light in the epitaxially grown epitaxial layer sequence, i.e., said layer has a scattering behavior that is as ergodic as possible.

A basic principle of a thin-layer LED chip is described, for example, in I. Schnitzer et al., Appl. Phys. Lett. 63 (16), Oct.

18, 1993, 2174-2176, whose disclosure content in this regard is hereby incorporated by reference.

A thin-film LED chip is, as a good approximation, a Lambertian surface radiator and is therefore particularly well suited for use in a floodlight.

In a further preferred embodiment, the LED array contains at least four radiation-emitting semiconductor chips. These are preferably connected to one another by the at least one conductive trace. In the LED array, for example a plurality of semiconductor chips can be connected to one another in the form of a series or parallel circuit by means of the at least one conductive trace.

An LED array according to the invention can be, for example, part of a lighting system, particularly part of a vehicle headlight or a projected-light source.

The invention is explained in greater detail hereinbelow with reference to an exemplary embodiment in conjunction with FIGS. 1 and 2.

BRIEF DESCRIPTION OF THE DRAWINGS

FIG. 1 is a schematic representation of a cross section through an exemplary embodiment of an LED array according to the invention and FIG. 2 is a schematic representation of a plan view of the exemplary embodiment of an LED array according to die invention depicted in FIG. 1.

Like or like-acting elements are provided with the same respective reference numerals in the figures.

DETAILED DESCRIPTION

In the exemplary embodiment of an LED array according to the invention illustrated in a cross section along line I-I in FIG. 1 and in plan in FIG. 2, four radiation-emitting semiconductor chips 2 are mounted on a common carrier body 1.

The semiconductor chips 2 each have an active zone 3 that preferably contains a III-V compound semiconductor material, particularly $In_xAl_yGa_{1-x-y}N$, $In_xAl_yGa_{1-x-y}$ or $In_xAl_yGa_{1-x-y}$, where $0 \leq x \leq 1$, $0 \leq y \leq 1$ and $x+y \leq 1$. The active zone 3 can be configured as a single heterostructure, double heterostructure, single quantum well structure or multiple quantum well structure. In the context of the application, the term "quantum well structure" encompasses any structure in which the charge carriers undergo quantization of their energy states by confinement. In particular, the term "quantum well structure" carries no implication as to the dimensionality of the quantization. It therefore includes, among other things, quantum troughs, quantum wires and quantum dots and any combination of these structures.

The radiation 4 emitted by each of the semiconductor chips 2 is outcoupled substantially through a respective radiation outcoupling surface 5 disposed opposite a respective base surface 6 that belongs to each semiconductor chip 2 and by means of which the semiconductor chips 2 are mounted on a common carrier body 1.

Each semiconductor chip 2 comprises, on its radiation outcoupling surface 5, at least one electrical contact 7, formed for example from a solder or an electrically conductive adhesive. By means of the electrical contacts 7, the semiconductor chips 2 are each connected electrically conductively to at least one conductive trace 9, 10 applied to a surface of a cover body 8 that faces toward the semiconductor chips 2.

The semiconductor chips 2 each have, for example, an additional electrical contact on base surface 6. Alternatively, the semiconductor chips 2 can have both an n-contact and a p-contact on radiation outcoupling surface 5.

The conductive traces 9, 10 are formed from a transparent conductive material, particularly from a transparent conductive oxide, such as ITO, for example. This has the advantage that no substantial absorption of the emitted radiation 4 in the conductive traces 9, 10 occurs even when the semiconductor chips 2 emit radiation 4 in their main direction through the conductive traces 9, 10. This makes it easier to run the conductive traces particularly when a multiplicity of semiconductor chips 2, for example four or more, are disposed in an LED array.

The cover body 8, which is transparent to the radiation 4 emitted by the semiconductor chips 2, is advantageously formed from a glass, particularly preferably from a borosilicate glass. For example, the cover body 8 is a glass plate. Alternatively, the cover body 8 can also be formed from a transparent synthetic material, preferably having a high UV resistance. The cover body can in particular be a cover film. In addition to its function as carrier of the conductive traces 9, 10, the cover body 8 also advantageously constitutes a protection for the semiconductor chips 2 against dirt or moisture.

Luminescence conversion materials are advantageously added to the cover body 8 to convert at least a portion of the radiation 4 emitted by the semiconductor chips 2 to a higher wavelength. These luminescence conversion materials can be, for example, ones that convert the ultraviolet and/or blue radiation emitted by the semiconductor chips 2 into the complementary region of the spectrum, particularly into the yellow region of the spectrum, in order thereby to generate white or mixed-color light. The luminescence conversion materials can, on the one hand, be added to the material from which the cover body 8 is formed. It is further conceivable for a layer 11 containing the luminescence conversion materials to be applied to a surface of the cover body 8 that is penetrated by the radiation 4 emitted in a main beam direction by the semiconductor chips 2. For example, a layer 11 containing luminescence conversion materials can be applied to the surface of cover body 8 facing away from the conductive traces 9, 10. Alternatively, it is also possible for the layer containing luminescence conversion materials to be applied to the surface of cover body 8 facing toward the semiconductor chips 2. The layer containing the luminescence conversion materials can further be applied to the radiation outcoupling surface 5 of each semiconductor chip 2.

Disposed after the cover body 8, as viewed from the semiconductor chips 2, there can be one or more optical elements 12 that serve the purpose of beam guidance and/or beam-shaping of the radiation 4 emitted by the semiconductor chips 2. In particular, optical elements 12 can be provided that reduce the divergence of the radiation 4 emitted by the semiconductor chips 2. For example, each of said optical elements 12 can be a CPC-, CEC- or CHC-type optical concentrator, preferably disposed very close to the cover plate 8 or even placed thereon.

Alternatively to the exemplary embodiment depicted in FIGS. 1 and 2, it is also possible for the cover body itself to be configured as an optical element.

To this end, for example a surface of cover body 8 that faces away from the semiconductor chips 2 is configured as a refractive or diffractive optical element. In particular, the surface of cover body 8 facing away from the semiconductor chips 2 can be bowed outward, in a lens-like manner. Furthermore, the side surfaces of the cover body 8 can also have a curved shape and/or can extend obliquely to the main beam direction of the radiation 4 emitted by the semiconductor chips 2.

The invention is not limited by the description with reference to the exemplary embodiments. Rather, the invention encompasses any novel feature and any combination of features, including in particular any combination of features recited in the claims, even if that feature or combination itself is not explicitly mentioned in the claims or exemplary embodiments.

The invention claimed is:

1. An LED array comprising a plurality of radiation-emitting semiconductor chips each of which has a radiation outcoupling surface, the radiation emitted by said semiconductor chips being outcoupled substantially through said radiation outcoupling surfaces, and a cover body that is transparent to the emitted radiation, characterized in that
    said transparent cover body comprises, on a surface facing toward said radiation outcoupling surfaces of said semiconductor chips, one or more conductive traces made of a conductive material that is transparent to said emitted radiation, said semiconductor chips each comprising, on said radiation outcoupling surface, at least one electrical contact that is connected to at least one of the plurality of said conductive traces, and
    at least one luminescence conversion material is contained in the transparent cover body and/or is applied in a layer to said cover body and/or to said semiconductor chips.

2. The LED array as in claim 1, wherein said transparent conductive material is a transparent conductive oxide.

3. The LED array as in claim 2, wherein said transparent conductive oxide is ITO.

4. The LED array as in claim 1, wherein said cover body is a cover plate.

5. The LED array as in claim 4, wherein said cover plate has a thickness of 100 µm or less.

6. The LED array as in claim 1, wherein said cover body is formed from a glass.

7. The LED array as in claim 1, wherein said electrical contact is formed from a solder or an electrically conductive adhesive.

8. The LED array as in claim 1, wherein said semiconductor chips each comprise a base surface disposed opposite said radiation outcoupling surface, said semiconductor chips being mounted by said base surface on a carrier body.

9. The LED array as in claim 1, wherein said plurality of semiconductor chips comprises at least four radiation-emitting semiconductor chips.

10. The LED array as in claim 1, wherein said LED array comprises at least one optical element for beam-shaping said radiation emitted by said semiconductor chips.

11. The LED array as in claim 10, wherein a distance between said optical element and said radiation outcoupling surface is 300 µm or less.

12. The LED array as in claim 11, wherein said optical element is a CPC-, CEC- or CHC-type optical concentrator.

13. The LED array as in claim 1, wherein said cover body is configured as an optical element.

14. The LED array as in claim 1, wherein said cover body is a cover film.

15. The LED array as in claim 1, wherein said semiconductor chips contain a III-V compound semiconductor material.

16. The LED array as in claim 1, wherein said semiconductor chips are thin-film light-emitting diode chips.

17. The LED array as in claim 4, wherein said cover plate has a thickness of 50 µm or less.

* * * * *

UNITED STATES PATENT AND TRADEMARK OFFICE
CERTIFICATE OF CORRECTION

| | |
|---|---|
| PATENT NO. | : 7,726,835 B2 |
| APPLICATION NO. | : 11/816951 |
| DATED | : June 1, 2010 |
| INVENTOR(S) | : Georg Bogner et al. |

It is certified that error appears in the above-identified patent and that said Letters Patent is hereby corrected as shown below:

Cover page, (75) Inventors:, delete "Jorg Erich Sorg" and insert -- Jörg Erich Sorg --.

Cover page, (73) Assignee:, delete "Osram Opto Semiconductors GmbH," and insert -- OSRAM Opto Semiconductors GmbH, --.

Signed and Sealed this
Nineteenth Day of February, 2013

Teresa Stanek Rea
*Acting Director of the United States Patent and Trademark Office*